(12) United States Patent
Matsumoto et al.

(10) Patent No.: US 12,500,564 B2
(45) Date of Patent: Dec. 16, 2025

(54) MULTILAYER ELECTRONIC COMPONENT

(71) Applicant: TDK CORPORATION, Tokyo (JP)

(72) Inventors: Yuki Matsumoto, Tokyo (JP); Naoyuki Mori, Tokyo (JP)

(73) Assignee: TDK CORPORATION, Tokyo (JP)

( * ) Notice: Subject to any disclaimer, the term of this patent is extended or adjusted under 35 U.S.C. 154(b) by 163 days.

(21) Appl. No.: 18/602,377

(22) Filed: Mar. 12, 2024

(65) Prior Publication Data
US 2024/0322780 A1    Sep. 26, 2024

(30) Foreign Application Priority Data
Mar. 24, 2023   (JP) ................ 2023-047672

(51) Int. Cl.
*H03H 7/01*   (2006.01)

(52) U.S. Cl.
CPC ........ *H03H 7/0153* (2013.01); *H03H 7/0115* (2013.01); *H03H 7/1783* (2013.01); *H03H 7/1725* (2013.01)

(58) Field of Classification Search
CPC ...... H03H 7/1783; H03H 7/09; H03H 7/0153; H03H 7/0115; H03H 7/1725; H03H 2001/0085
See application file for complete search history.

(56) References Cited

U.S. PATENT DOCUMENTS

| | | | |
|---|---|---|---|
| 2013/0229241 A1 | 9/2013 | Imamura | |
| 2021/0099149 A1* | 4/2021 | Lan | ........ H03H 7/1741 |
| 2021/0257984 A1* | 8/2021 | Sato | ........ H03H 7/1766 |
| 2022/0294408 A1* | 9/2022 | Sato | ........ H01F 27/40 |

* cited by examiner

*Primary Examiner* — Quan Tra
(74) *Attorney, Agent, or Firm* — Oliff PLC

(57) ABSTRACT

First to fourth filters of an electronic component are provided in a manner that a first path from the first filter to the second filter includes a second path from the third filter to the fourth filter and is also longer than the second path in a circuit configuration. First to fourth inductors of the first to fourth filters are arranged in a manner that an opening of the first inductor and an opening of the third inductor face each other, an opening of the second inductor and an opening of the fourth inductor face each other, and a pair of the second inductor and the fourth inductor is adjacent to a pair of the first inductor and the third inductor.

9 Claims, 10 Drawing Sheets

MULTILAYER ELECTRONIC COMPONENT

CROSS REFERENCE TO RELATED APPLICATIONS

This application claims the benefit of Japanese Priority Patent Application No. 2023-47672 filed on Mar. 24, 2023, the entire contents of which are incorporated herein by reference.

BACKGROUND OF THE INVENTION

1. Field of the Invention

The present invention relates to a multilayer electronic component including a low-pass filter and a high-pass filter.

2. Description of the Related Art

One of electronic components used in a communication apparatus is a band-pass filter. Such a band-pass filter can be constituted, for example, by connecting a high-pass filter forming an attenuation pole on a low-frequency side of the passband of the band-pass filter and a low-pass filter forming an attenuation pole on a high-frequency side of the passband of the band-pass filter, in series.

The recent market demands for reductions in size and footprint of the compact mobile communication apparatuses and also requires miniaturization of band-pass filters for use in those communication apparatuses. One known example of a band-pass filter suitable for downsizing is a band-pass filter using a stack including a plurality of dielectric layers and a plurality of conductor layers stacked together.

Each of a high-pass filter and a low-pass filter includes an inductor. One known example of such an inductor used for a band-pass filter using a stack is an inductor composed of a conductor layer and a plurality of through holes and wound around an axis orthogonal to a stacking direction of a plurality of dielectric layers.

US 2013/0229241 A1 discloses a multilayer band pass filter that is not a band-pass filter composed of a high-pass filter and a low-pass filter but includes a plurality of inductors each wound around an axis orthogonal to a stacking direction of a plurality of dielectric layers.

For a band-pass filter, to achieve desired characteristics, a plurality of low-pass filters and a plurality of high-pass filters are used in some cases. Here, consider a band-pass filter provided with two high-pass filters between two low-pass filters in a circuit configuration. In this band-pass filter, the two low-pass filters are not electrically connected to each other. For this reason, this band-pass filter has a problem that adjustment of magnetic coupling between the two low-pass filters is difficult.

The above-described problem applies not only to such a band-pass filter composed of a plurality of high-pass filters and a plurality of low-pass filters but also to multilayer electronic components in general provided with two high-pass filters between two low-pass filters in a circuit configuration.

SUMMARY OF THE INVENTION

An object of the present invention is to provide a multilayer electronic component including two low-pass filters and two high-pass filters and facilitating adjustment of characteristics between the two low-pass filters.

A multilayer electric component of the present invention includes: a first filter which is a low-pass filter including a first inductor; a second filter which is a low-pass filter including a second inductor; a third filter which is a high-pass filter including a third inductor; a fourth filter which is a high-pass filter including a fourth inductor; and a stack for integrating the first filter, the second filter, the third filter, and the fourth filter, the stack including a plurality of dielectric layers stacked together. The first filter, the second filter, the third filter, and the fourth filter are provided in a manner that a first path from the first filter to the second filter includes a second path from the third filter to the fourth filter and is also longer than the second path in a circuit configuration. Each of the first inductor, the second inductor, the third inductor, and the fourth inductor is wound around an axis orthogonal to a stacking direction of the plurality of dielectric layers. The first inductor, the second inductor, the third inductor, and the fourth inductor are arranged in a manner that an opening of the first inductor and an opening of the third inductor face each other, an opening of the second inductor and an opening of the fourth inductor face each other, and a pair of the second inductor and the fourth inductor is adjacent to a pair of the first inductor and the third inductor.

In the multilayer electronic component of the present invention, the first inductor, the second inductor, the third inductor, and the fourth inductor are arranged as described above. Hence, according to the present invention, it is possible to provide a multilayer electronic component for which adjustment of characteristics between a first filter and a second filter is facilitated.

Other and further objects, features and advantages of the present invention will appear more fully from the following description.

DETAILED DESCRIPTION OF THE PREFERRED EMBODIMENTS

First Embodiment

Figure 1:
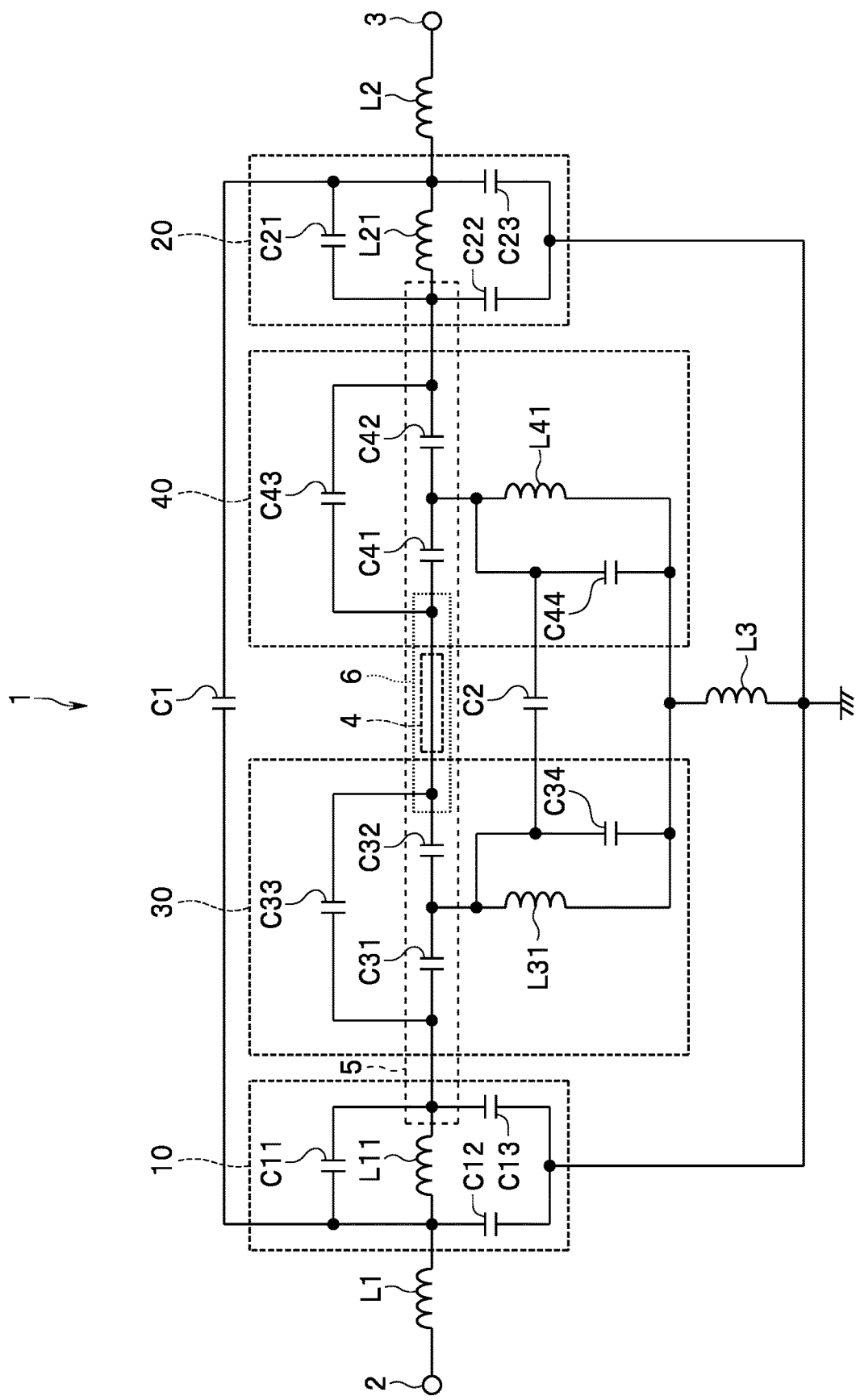
FIG. 1 is a circuit diagram showing a circuit configuration of a multilayer electronic component according to a first embodiment of the present invention.

An embodiment of the present invention will be described below in detail with reference to the drawings. First, a configuration of a multilayer electronic component (hereinafter simply referred to as electronic component) 1 according to the present embodiment will be outlined with reference to FIG. 1.

The electronic component 1 includes a first signal terminal 2, a second signal terminal 3, a first filter 10, a second filter 20, a third filter 30, and a fourth filter 40. Each of the first and second signal terminals 2 and 3 is a terminal for inputting or outputting a signal. In other words, when a signal is input to the first signal terminal 2, a signal is output from the second signal terminal 3. When a signal is input to the second signal terminal 3, a signal is output from the first signal terminal 2.

The first filter 10 is a low-pass filter including a first inductor. The second filter 20 is a low-pass filter including a second inductor. The third filter 30 is a high-pass filter including a third inductor. The fourth filter 40 is a high-pass filter including a fourth inductor. The first to fourth filters 10, 20, 30, and 40 are provided between the first signal terminal 2 and the second signal terminal 3 in a circuit configuration. Note that, in the present application, the expression "in the(a) circuit configuration" is used to indicate not a layout in a physical configuration but a layout in a circuit diagram.

Arrangement of the first to fourth filter 10, 20, 30, and 40 will be described below in detail. Here, a path from the first filter 10 to the second filter 20 is referred to as a first path 5, and a path from the third filter 30 to the fourth filter 40 is referred to as a second path 6. As will be described later, each of the third and fourth filters 30 and 40 includes a plurality of capacitors. In particular, in the present embodiment, the second path 6 includes a path 4 electrically connecting one capacitor of the third filter 30 and one capacitor of the fourth filter 40. The first to fourth filters 10, 20, 30, and 40 are provided in a manner that the first path 5 includes the second path 6 and is also longer than the second path 6 in the circuit configuration.

The first filter 10 is connected to the first signal terminal 2. The second filter 20 is connected to the second signal terminal 3. The third filter 30 is provided between the first filter 10 and the second filter 20 in the circuit configuration. The fourth filter 40 is arranged between the third filter 30 and the second filter 20 in the circuit configuration. Specifically, the first to fourth filters 10, 20, 30, and 40 are connected in series in the order of the first filter 10 (low-pass filter), the third filter 30 (high-pass filter), the fourth filter 40 (high-pass filter), and then the second filter 20 (low-pass filter) from the first signal terminal 2 toward the second signal terminal 3.

The first to fourth filters 10, 20, 30, and 40 constitute a band-pass filter that selectively passes a signal of a frequency within a certain passband.

Next, an example of a circuit configuration of the electronic component 1 will be described with reference to FIG. 1. The electronic component 1 further includes inductors L1, L2, and L3 and capacitors C1 and C2. One end of the inductor L1 is connected to the first signal terminal 2.

The first filter 10 is connected to the other end of the inductor L1. The first filter 10 includes a first inductor L11 and capacitors C11, C12, and C13. One end of the first inductor L11 is connected to the other end of the inductor L1.

The capacitor C11 is connected in parallel with the first inductor L11. One end of the capacitor C12 is connected to the one end of the first inductor L11. One end of the capacitor C13 is connected to the other end of the first inductor L11. The other end of each of the capacitors C12 and C13 is grounded.

The third filter 30 is connected to the other end of the first inductor L11 of the first filter 10. The third filter 30 includes a third inductor L31 and capacitors C31, C32, C33, and C34.

One end of the capacitor C31 is connected to the other end of the first inductor L11. One end of the capacitor C32 is connected to the other end of the capacitor C31. One end of the capacitor C33 is connected to the one end of the capacitor C31. The other end of the capacitor C33 is connected to the other end of the capacitor C32.

One end of the third inductor L31 is connected to a connection point between the capacitor C31 and the capacitor C32. The capacitor C34 is connected in parallel with the third inductor L31.

The fourth filter 40 is connected to the other end of the capacitor C32 of the third filter 30. The fourth filter 40 includes a fourth inductor L41 and capacitors C41, C42, C43, and C44.

One end of the capacitor C41 is connected to the other end of the capacitor C32. One end of the capacitor C42 is connected to the other end of the capacitor C41. One end of the capacitor C43 is connected to the one end of the capacitor C41. The other end of the capacitor C43 is connected to the other end of the capacitor C42.

One end of the fourth inductor L41 is connected to a connection point between the capacitor C41 and the capacitor C42. The capacitor C44 is connected in parallel with the fourth inductor L41.

One end of the capacitor C2 is connected to the one end of the third inductor L31. The other end of the capacitor C2 is connected to the one end of the fourth inductor L41.

One end of the inductor L3 is connected to the other end of each of the third and fourth inductors L31 and L41. The other end of the inductor L3 is grounded.

The second filter 20 is connected to the other end of the capacitor C42 of the fourth filter 40. The second filter 20 includes a second inductor L21 and capacitors C21, C22, and C23. One end of the second inductor L21 is connected to the other end of the capacitor C42.

The capacitor C21 is connected in parallel with the second inductor L21. One end of the capacitor C22 is connected to the one end of the second inductor L21. One end of the capacitor C23 is connected to the other end of the second inductor L21. The other end of each of the capacitors C22 and C23 is grounded.

One end of the inductor L2 is connected to the other end of the second inductor L21 of the second filter 20. The other end of the inductor L2 is connected to the second signal terminal 3.

One end of the capacitor C1 is connected to the other end of the inductor L1. The other end of the capacitor C1 is connected to the one end of the inductor L2.

The path 4 is a path electrically connecting the other end of the capacitor C32 of the third filter 30 and the one end of the capacitor C41 of the fourth filter 40. The second path 6 is substantially the same path as the path 4. Note that an aspect electrically connecting two elements include an aspect where the two elements are directly connected to each other through a conductor and an aspect where the two elements are connected to each other through an inductor. Meanwhile, an aspect where a conductor of the path connecting the two elements is broken, as an aspect where the two elements are connected to each other through a capacitor, is not included in an aspect where the two elements are electrically connected to each other.

The first path 5 is a path from the other end of the first inductor L11 of the first filter 10 to the one end of the second inductor L21 of the second filter 20. The first path 5 may be a path passing through the capacitors C31 and C32, the path 4, and the capacitors C41 and C42, for example.

In the example shown in FIG. 1, the first filter 10 and the second filter 20 have circuit configurations symmetric with respect to the inductor L3 and the capacitors C1 and C2. Specifically, in the electronic component 1, arrangements of the inductor and the capacitors included in the first filter 10 and the inductor and the capacitors included in the second filter 20 in the circuit diagram are symmetric with respect to the inductor L3 and the capacitors C1 and C2.

Similarly, in the example shown in FIG. 1, the third filter 30 and the fourth filter 40 have circuit configurations symmetric with respect to the inductor L3 and the capacitor C2. Specifically, in the electronic component 1, arrangements of the inductor and the capacitors included in the third filter 30 and the inductor and the capacitors included in the fourth filter 40 in the circuit diagram are symmetric with respect to the inductor L3 and the capacitor C2.

Figure 2:
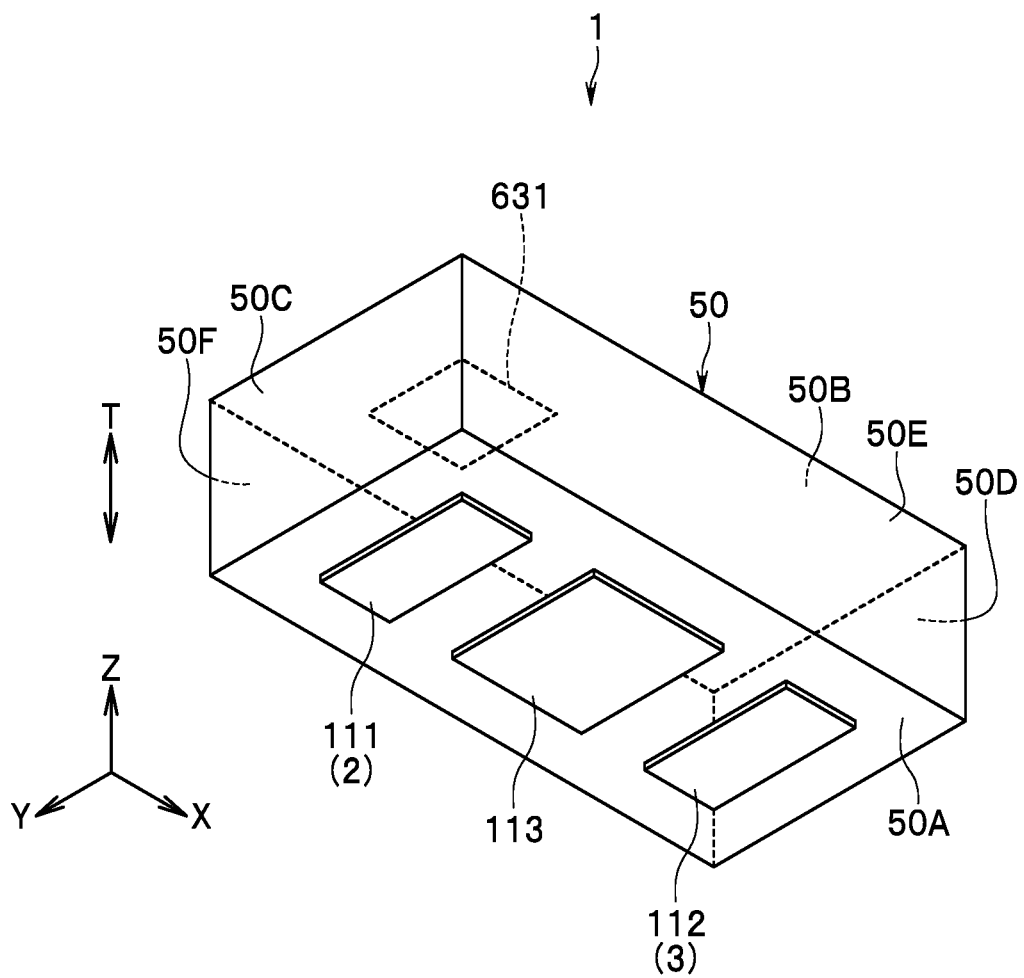
FIG. 2 is a perspective view showing an appearance of the multilayer electronic component according to the first embodiment of the present invention.

Next, other configurations of the electronic component 1 will be described with reference to FIG. 2. FIG. 2 is a perspective view showing an appearance of the electronic component 1.

The electronic component 1 further includes a stack 50 including a plurality of dielectric layers and a plurality of conductors (plurality of conductor layers and plurality of through holes) stacked together. The first signal terminal 2, the second signal terminal 3, the first to fourth filters 10, 20, 30, and 40, the inductors L1 to L3, and the capacitors C1 and C2 are integrated with the stack 50.

The stack 50 has a first surface 50A and a second surface 50B located at both ends in a stacking direction T of the plurality of dielectric layers, and four side surfaces 50C to 50F connecting the first surface 50A and the second surface 50B. The side surfaces 50C and 50D are opposite to each other. The side surfaces 50E and 50F are opposite to each other. The side surfaces 50C to 50F are perpendicular to the first surface 50A and the second surface 50B.

Here, as shown in FIG. 2, an X direction, a Y direction, and a Z direction are defined. The X direction, the Y direction, and the Z direction are orthogonal to one another. In the present embodiment, a direction parallel to the stacking direction T is defined as the Z direction. A direction opposite to the X direction is defined as a −X direction, a direction opposite to the Y direction is defined as a −Y direction, and a direction opposite to the Z direction is defined as a −Z direction. The expression of "when seen from the stacking direction T" means that an object is seen from a position away in the Z direction or the −Z direction.

As shown in FIG. 2, the first surface 50A is located at the end of the stack 50 in the −Z direction. The first surface 50A serves also as a bottom surface of the stack 50. The second surface 50B is located at the end of the stack 50 in the Z direction. The second surface 50B serves also as a top surface of the stack 50. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The electronic component 1 further includes electrodes 111, 112, and 113 provided on the first surface 50A of the stack 50. The electrode 111 extends in the Y direction near the side surface 50C. The electrode 112 extends in the Y direction near the side surface 50D. The electrode 113 is arranged between the electrode 111 and the electrode 112.

The electrode 111 corresponds to the first signal terminal 2, and the electrode 112 corresponds to the second signal terminal 3. The first and second signal terminals 2 and 3 are thus provided on the first surface 50A of the stack 50. The electrode 113 is grounded.

Next, an example of the plurality of dielectric layers and the plurality of conductors constituting the stack 50 will be described with reference to FIG. 3A to FIG. 6. In this example, the stack 50 includes thirteen dielectric layers stacked together. The thirteen dielectric layers will be referred to as first to thirteenth dielectric layers in the order from bottom to top. The first to thirteenth dielectric layers are denoted by reference numerals 51 to 63, respectively.

In FIG. 3A to FIG. 5B, each circle represents a through hole. The dielectric layers 51 to 61 each have a plurality of through holes. The plurality of through holes are each formed by filling a hole intended for a through hole with a conductive paste. Each of the plurality of through holes is connected to an electrode, a conductor layer, or another through hole. In the following description, for a connection relationship between each of the plurality of through holes and an electrode, a conductor layer, or another through hole, the connection relationship in a state where the first to thirteenth dielectric layers 51 to 63 are stacked together is described. In FIG. 3A to FIG. 5B, a plurality of specific through holes of the plurality of through holes are denoted by reference numerals.

Figure 3A:
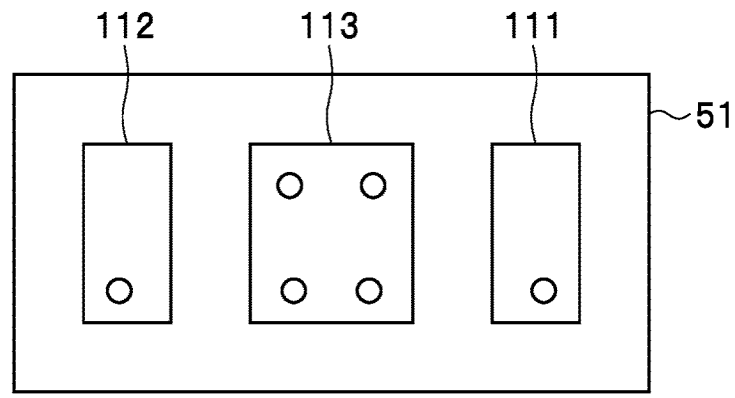
FIG. 3A to FIG. 3C are explanatory diagrams showing respective patterned surfaces of first to third dielectric layers of a stack of the multilayer electronic component according to the first embodiment of the present invention.

FIG. 3A shows a patterned surface of the first dielectric layer 51. The electrodes 111 to 113 are formed on the patterned surface of the dielectric layer 51.

Figure 3B:
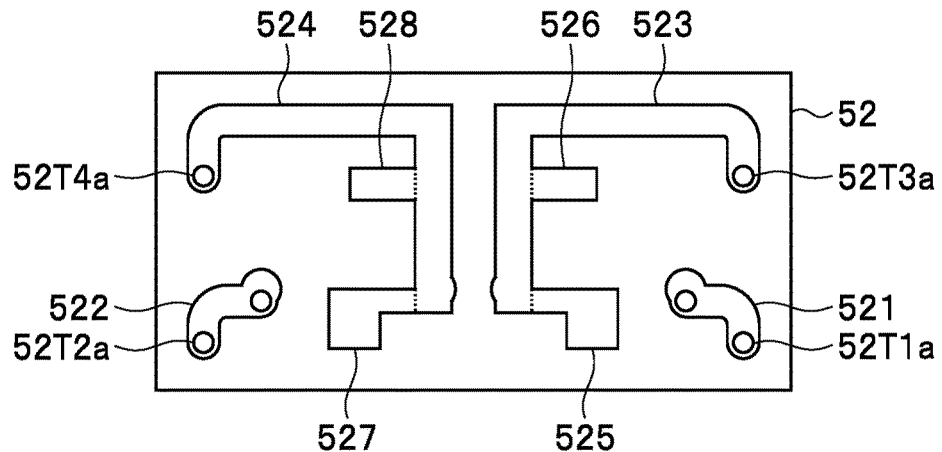

FIG. 3B shows a patterned surface of the second dielectric layer 52. Conductor layers 521, 522, 523, 524, 525, 526, 527, and 528 are formed on the patterned surface of the dielectric layer 52. The conductor layers 525 and 526 are connected to the conductor layer 523. The conductor layers 527 and 528 are connected to the conductor layer 524. In FIG. 3B, a boundary between each two conductor layers is indicated by a dotted line.

A through hole denoted by a reference numeral 52T1a in FIG. 3B is connected to the conductor layer 521. Note that the through hole denoted by the reference numeral 52T1a is referred to simply as a through hole 52T1a in the following description. A through hole denoted by a reference numeral other than the through hole 52T1a is referred to similarly to the through hole 52T1a.

Through holes 52T2a, 52T3a, and 52T4a shown in FIG. 3B are connected respectively to the conductor layers 522, 523, and 524.

Figure 3C:
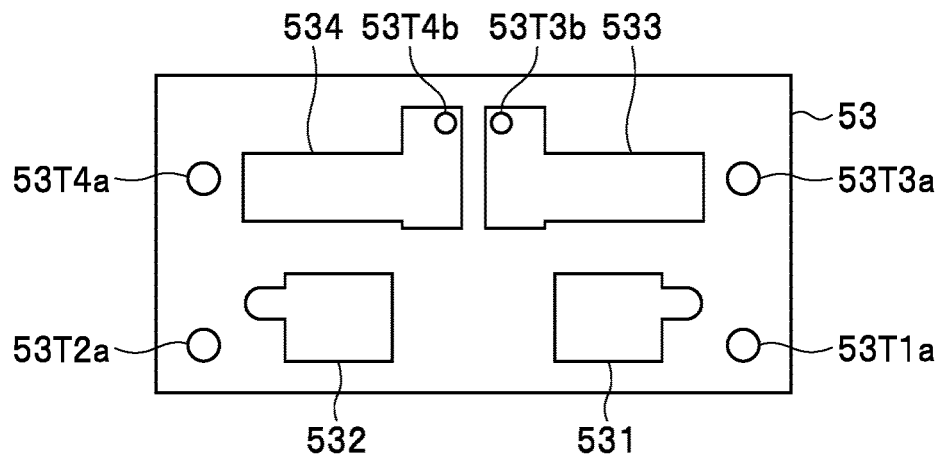

FIG. 3C shows a patterned surface of the third dielectric layer 53. Conductor layer 531, 532, 533, and 534 are formed on the patterned surface of the dielectric layer 53. The through holes 52T1a, 52T2a, 52T3a, and 52T4a are connected respectively to through holes 53T1a, 53T2a, 53T3a, and 53T4a shown in FIG. 3C. The through holes 53T3b and 53T4b shown in FIG. 3C are connected respectively to the conductor layers 533 and 534.

Figure 4A:
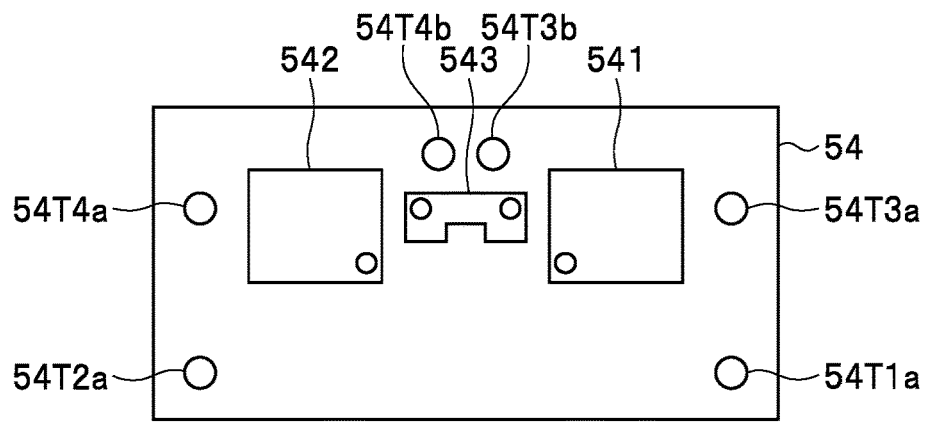
FIG. 4A to FIG. 4C are explanatory diagrams showing respective patterned surfaces of fourth to sixth dielectric layers of the stack of the multilayer electronic component according to the first embodiment of the present invention.

FIG. 4A shows a patterned surface of the fourth dielectric layer 54. Conductor layers 541, 542, and 543 are formed on the patterned surface of the dielectric layer 54. The through holes 53T1a, 53T2a, 53T3a, 53T3b, 53T4a, and 53T4b are connected respectively to through holes 54T1a, 54T2a, 54T3a, 54T3b, 54T4a, and 54T4b shown in FIG. 4A.

Figure 4B:
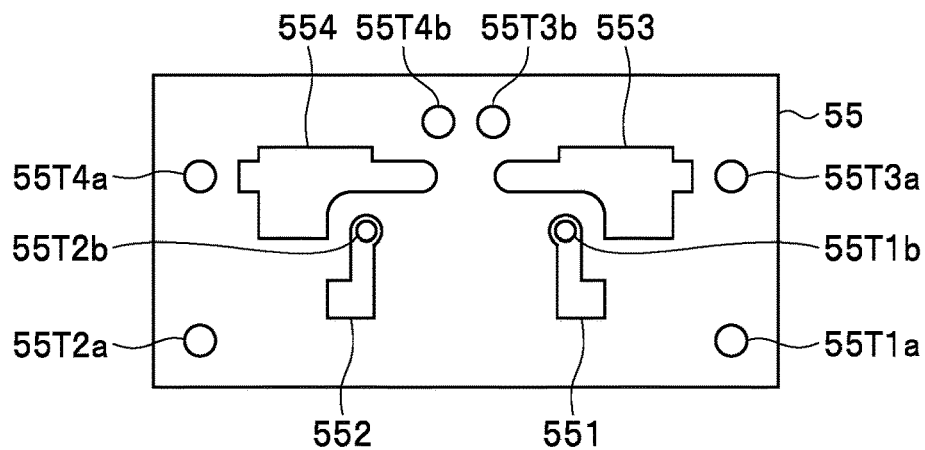

FIG. 4B shows a patterned surface of the fifth dielectric layer 55. Conductor layers 551, 552, 553, and 554 are formed on the patterned surface of the dielectric layer 55. The through holes 54T1a, 54T2a, 54T3a, 54T3b, 54T4a, and 54T4b are connected respectively to through holes 55T1a, 55T2a, 55T3a, 55T3b, 55T4a, and 55T4b shown in FIG. 4B. The through holes 55T1b and 55T2b shown in FIG. 4B are connected respectively to the conductor layers 551 and 552.

Figure 4C:
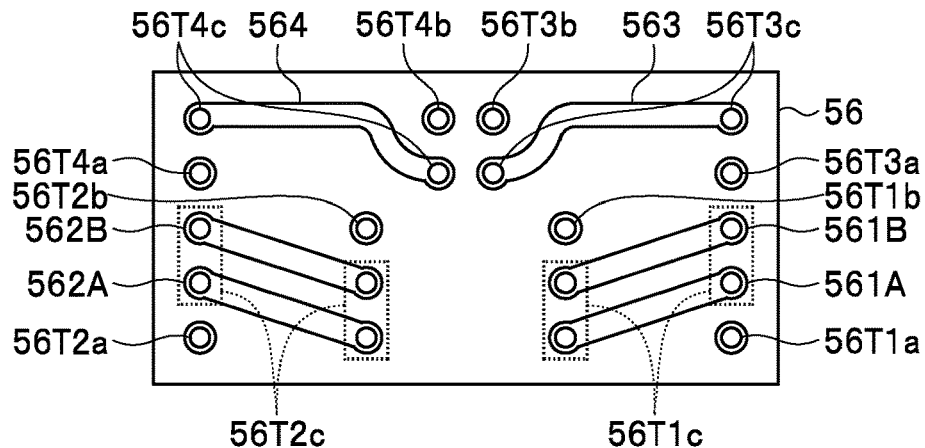

FIG. 4C shows a patterned surface of the sixth dielectric layer 56. Inductor conductor layers 561A, 561B, 562A, 562B, 563, and 564 are formed on the patterned surface of the dielectric layer 56. The through holes 55T1a, 55T1b, 55T2a, 55T2b, 55T3a, 55T3b, 55T4a, and 55T4b are connected respectively to through holes 56T1a, 56T1b, 56T2a, 56T2b, 56T3a, 56T3b, 56T4a, and 56T4b shown in FIG. 4C.

Each of four through holes arranged in frames indicated by dotted lines denoted by a reference numeral 56T1c in FIG. 4C is connected to one of the conductor layers 561A and 561B and also connected to a portion of the connected conductor layer near one end or a portion of the conductor layer near the other end. Note that the through holes arranged in the frames indicated by the dotted lines denoted by the reference numeral 56T1c are referred to simply as a through hole 56T1c in the following description. A through hole arranged in a frame denoted by a reference numeral other than the reference numeral 56T1c is referred to similarly to the through hole 56T1c.

Each of four through holes 56T2c shown in FIG. 4C is connected to one of the conductor layers 562A and 562B and also connected to a portion of the connected conductor layer near one end or a portion of the conductor layer near the other end.

Each of two through holes 56T3c shown in FIG. 4C is connected to a portion of the conductor layer 563 near one end or a portion of the conductor layer 563 near the other end. Each of two through holes 56T4c shown in FIG. 4C is connected to a portion of the conductor layer 564 near one end or a portion of the conductor layer 564 near the other end.

Figure 5A:
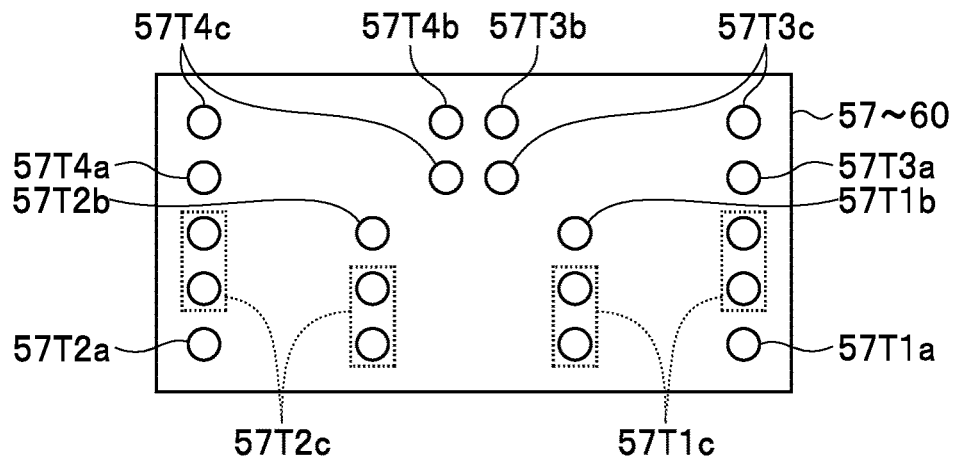
FIG. 5A is an explanatory diagram showing a patterned surface of each of seventh to tenth dielectric layers of the stack of the multilayer electronic component according to the first embodiment of the present invention.

FIG. 5A shows a patterned surface of each of the seventh to tenth dielectric layers 57 to 60. The through holes 56T1a, 56T1b, 56T2a, 56T2b, 56T3a, 56T3b, 56T4a, and 56T4b are connected respectively to through holes 57T1a, 57T1b, 57T2a, 57T2b, 57T3a, 57T3b, 57T4a, and 57T4b formed in the dielectric layer 57.

The four through holes 56T1c are connected to four respective through holes 57T1c formed in the dielectric layer 57. The four through holes 56T2c are connected to four respective through holes 57T2c formed in the dielectric layer 57. The two through holes 56T3c are connected to two respective through holes 57T3c formed in the dielectric layer 57. The two through holes 56T4c are connected to two respective through holes 57T4c formed in the dielectric layer 57.

In the dielectric layers 57 to 60, every vertically adjacent through holes denoted by the same reference signs are connected to each other.

Figure 5B:
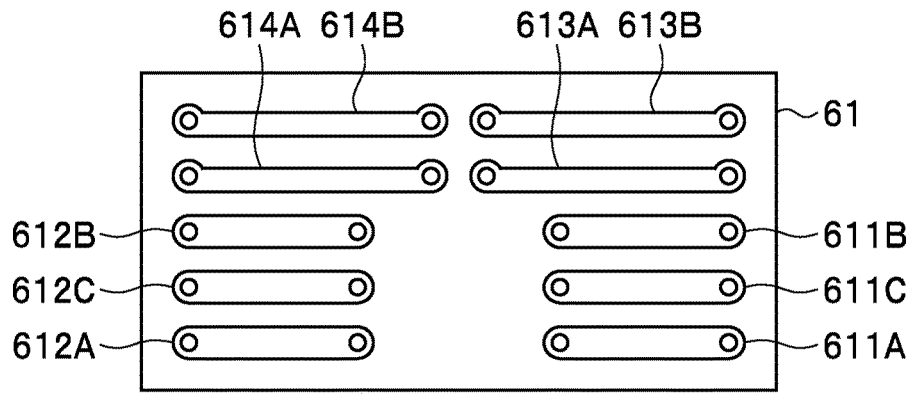
FIG. 5B is an explanatory diagram showing a patterned surface of an eleventh dielectric layer of the stack of the multilayer electronic component according to the first embodiment of the present invention.

FIG. 5B shows a patterned surface of the eleventh dielectric layer 61. Inductor conductor layers 611A, 611B, 611C, 612A, 612B, 612C, 613A, 613B, 614A, and 614B are formed on the patterned surface of the dielectric layer 61.

The through holes 57T1a, 57T1b, 57T2a, 57T2b, 57T3a, 57T3b, 57T4a, and 57T4b formed in the dielectric layer 60 are connected respectively to a portion of the conductor layer 611A near one end, a portion of the conductor layer 611B near one end, a portion of the conductor layer 612A near one end, a portion of the conductor layer 612B near one end, a portion of the conductor layer 613A near one end, a portion of the conductor layer 613B near one end, a portion of the conductor layer 614A near one end, and a portion of the conductor layer 614B near one end.

The four respective through holes 57T1c formed in the dielectric layer 60 are connected to a portion of the conductor layer 611A near the other end, a portion of the conductor layer 611B near the other end, a portion of the conductor layer 611C near one end, and a portion of the conductor layer 611C near the other end. The four respective through holes 57T2c formed in the dielectric layer 60 are connected to a portion of the conductor layer 612A near the other end, a portion of the conductor layer 612B near the other end, a portion of the conductor layer 612C near one end, and a portion of the conductor layer 612C near the other end.

The two respective through holes 57T3c formed in the dielectric layer 60 are connected to a portion of the conductor layer 613A near the other end and a portion of the conductor layer 613B near the other end. The two respective through holes 57T4c formed in the dielectric layer 60 are connected to a portion of the conductor layer 614A near the other end and a portion of the conductor layer 614B near the other end.

Figure 5C:
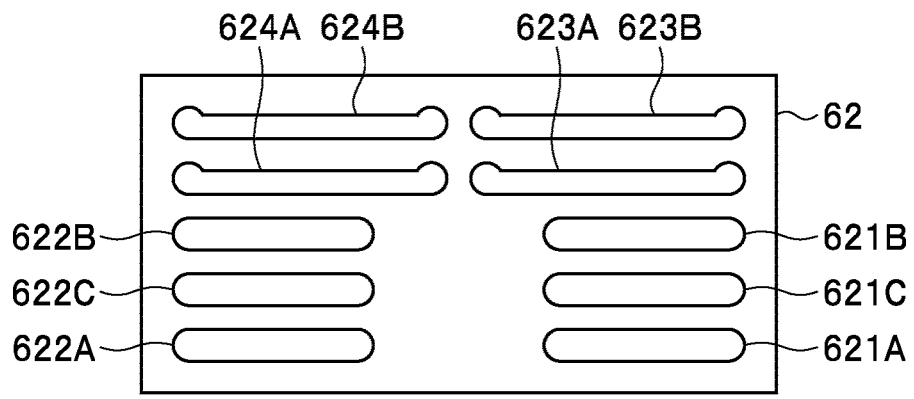
FIG. 5C is an explanatory diagram showing a patterned surface of a twelfth dielectric layer of the stack of the multilayer electronic component according to the first embodiment of the present invention.

FIG. 5C shows a patterned surface of the twelfth dielectric layer 62. Inductor conductor layers 621A, 621B, 621C, 622A, 622B, 622C, 623A, 623B, 624A, and 624B are formed on the patterned surface of the dielectric layer 62.

Figure 6:
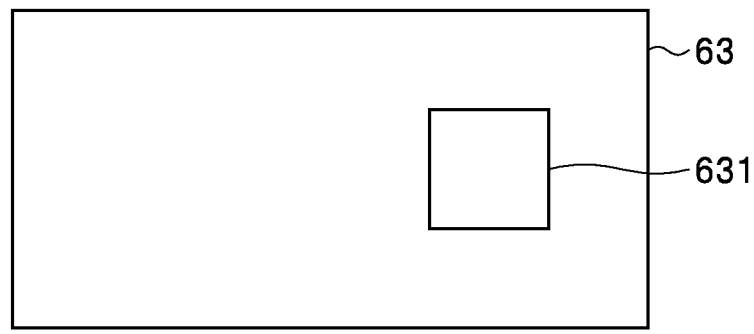
FIG. 6 is an explanatory diagram showing a patterned surface of a thirteenth dielectric layer of the stack of the multilayer electronic component according to the first embodiment of the present invention.

FIG. 6 shows a patterned surface of the thirteenth dielectric layer 63. A mark 631 is formed on the patterned surface of the dielectric layer 63.

The stack 50 shown in FIG. 2 is formed by stacking the first to thirteenth dielectric layers 51 to 63 in a manner that the patterned surface of the first dielectric layer 51 serves as the first surface 50A of the stack 50 and a surface of the thirteenth dielectric layer 63 opposite to the patterned surface thereof serves as the second surface 50B of the stack 50.

Figure 7:
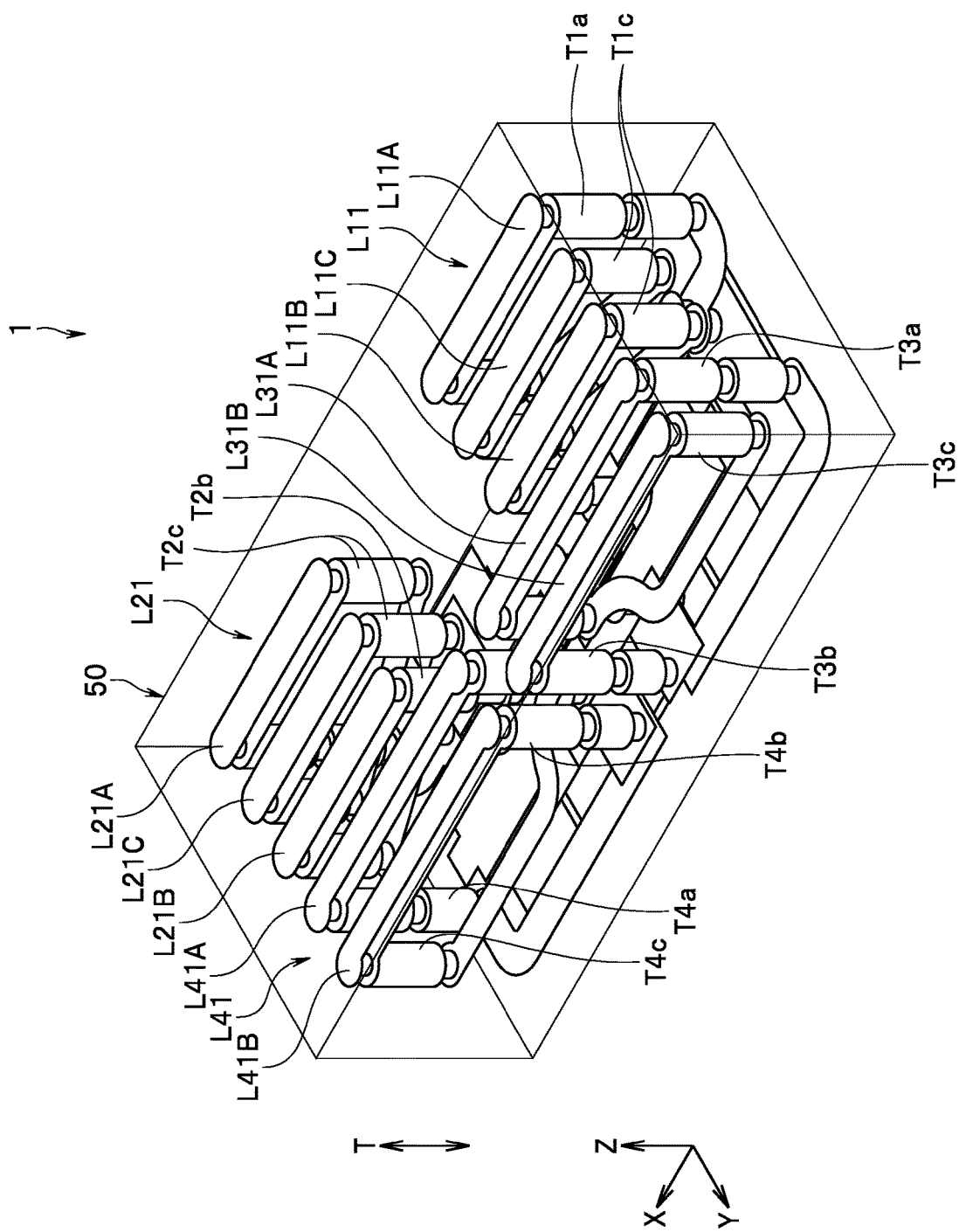
FIG. 7 is a perspective view showing an internal structure of the stack of the multilayer electronic component according to the first embodiment of the present invention.

FIG. 7 shows an internal structure of the stack 50 formed by stacking the first to thirteenth dielectric layers 51 to 63. As shown in FIG. 7, the plurality of conductor layers and the plurality of through holes shown in FIG. 3A to FIG. 5C are stacked together inside the stack 50. In FIG. 7, the mark 631 is omitted.

Correspondences between the circuit components of the electronic component 1 shown in FIG. 1 and the internal components of the stack 50 shown in FIG. 3A to FIG. 5C will now be described. Components of the first filter 10 will initially be described. The first inductor L11 is composed of the inductor conductor layers 561A, 561B, 611A, 611B, 611C, 621A, 621B, and 621C and the through holes 52T1a, 53T1a, 54T1a, 55T1a, 55T1b, 56T1a, 56T1b, 57T1a, and 57T1b, and a plurality of through holes connecting a pair of the conductor layers 611A and 621A, a pair of the conductor layers 611B and 621B, and a pair of the conductor layers 611C and 621C.

The capacitor C11 is composed of the conductor layers 531 and 551 and the dielectric layers 53 and 54 interposed between those conductor layers. The capacitor C12 is composed of the conductor layers 525 and 531 and the dielectric layer 52 interposed between those conductor layers. The capacitor C13 is composed of the conductor layers 523 and 541 and the dielectric layers 52 and 53 interposed between those conductor layers.

Next, components of the second filter 20 will be described. The second inductor L21 is composed of the inductor conductor layers 562A, 562B, 612A, 612B, 612C, 622A, 622B, and 622C, the through holes 52T2a, 53T2a, 54T2a, 55T2a, 55T2b, 56T2a, 56T2b, 57T2a, and 57T2b, and a plurality of through holes connecting a pair of the conductor layers 612A and 622A, a pair of the conductor layers 612B and 622B, and a pair of the conductor layers 612C and 622C.

The capacitor C21 is composed of the conductor layers 532 and 552 and the dielectric layers 53 and 54 interposed between those conductor layers. The capacitor C22 is composed of the conductor layers 524 and 542 and the dielectric layers 52 and 53 interposed between those conductor layers. The capacitor C23 is composed of the conductor layers 527 and 532 and the dielectric layer 52 interposed between those conductor layers.

Next, components of the third filter 30 will be described. The third inductor L31 is composed of the inductor conductor layers 563, 613A, 613B, 623A, and 623B, the through holes 52T3a, 53T3a, 53T3b, 54T3a, 54T3b, 55T3a, 55T3b, 56T3a, 56T3b, 57T3a, and 57T3b, and a plurality of through holes connecting a pair of the conductor layers 613A and 623A and a pair of the conductor layers 613B and 623B.

The capacitor C31 includes capacitance composed of the conductor layers 533 and 541 and the dielectric layer 53 interposed between those conductor layers and floating capacitance generated between the first inductor L11 and the third inductor L31 facing each other. The capacitor C32 is formed by the conductor layers 533 and 553 and the dielectric layers 53 and 54 interposed between those conductor layers. The capacitor C33 is formed by the conductor layers 541 and 553 and the dielectric layer 54 interposed between those conductor layers. The capacitor C34 is composed of the conductor layers 526 and 533 and the dielectric layer 52 interposed between the conductor layers.

Next, components of the fourth filter 40 will be described. The fourth inductor L41 is composed of the inductor conductor layers 564, 614A, 614B, 624A, and 624B, the through holes 52T4a, 53T4a, 53T4b, 54T4a, 54T4b, 55T4a, 55T4b, 56T4a, 56T4b, 57T4a, and 57T4b, and a plurality of through holes connecting a pair of the conductor layers 614A and 624A and a pair of the conductor layers 614B and 624B.

The capacitor C41 is composed of the conductor layers 534 and 554 and the dielectric layers 53 and 54 interposed between those conductor layers. The capacitor C42 includes capacitance formed by the conductor layers 534 and 542 and the dielectric layer 53 interposed between those conductor layers and floating capacitance generated between the second inductor L21 and the fourth inductor L41 facing each other. The capacitor C43 is composed of the conductor layers 542 and 554 and the dielectric layer 54 interposed between those conductor layers. The capacitor C44 is composed of the conductor layers 528 and 534 and the dielectric layer 52 interposed between those conductor layers.

Next, the inductors L1 to L3 and the capacitors C1 and C2 will be described. The inductor L1 is composed of a through hole connecting the electrode 111 and the conductor layer 521. The inductor L2 is composed of a through hole connecting the electrode 112 and the conductor layer 522. The inductor L3 is composed of the conductor layers 523 and 524, a plurality of through holes connecting the electrode 113 and the conductor layer 523, and a plurality of through holes connecting the electrode 113 and the conductor layer 524.

The capacitor C1 is floating capacitance generated between the first inductor L11 and the second inductor L21. The capacitor C2 includes capacitance formed by the conductor layers 533, 534, and 543 and the dielectric layer 53 interposed between those conductor layers and floating capacitance generated between the third inductor L31 and the fourth inductor L41.

Figure 8:
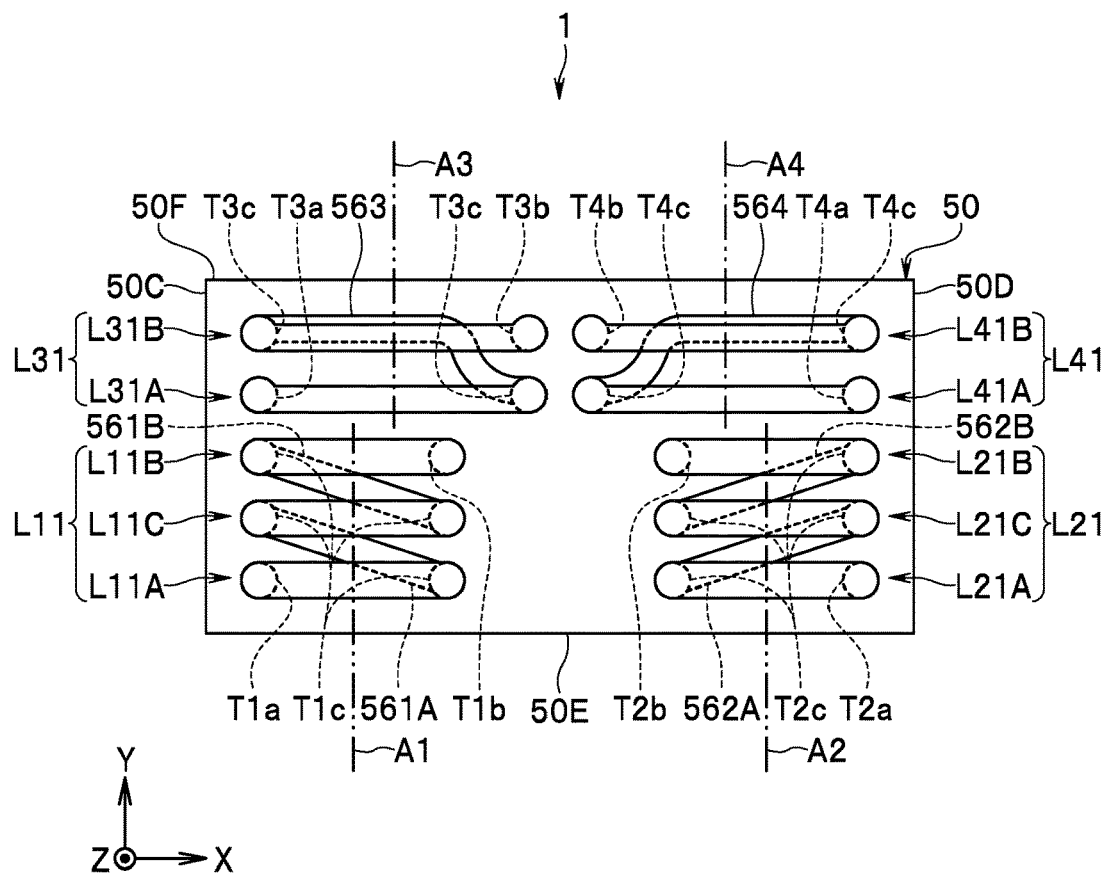
FIG. 8 is a plan view showing part of the internal structure of the stack of the multilayer electronic component according to the first embodiment of the present invention.

Next, structural features of the electronic component 1 according to the present embodiment will be described with reference to FIG. 1 to FIG. 8. FIG. 8 is a plan view showing part of the internal structure of the stack 50, concretely, the first to fourth inductors L11, L21, L31, and L41.

Each of the first inductor L11 of the first filter 10, the second inductor L21 of the second filter 20, the third inductor L31 of the third filter 30, and the fourth inductor L41 of the fourth filter 40 is also a rectangular or approximately rectangular winding. For the rectangular or approximately rectangular winding, the number of windings may be counted, when the winding is regarded as a rectangle, as ¼ per side of the rectangle. The number of windings of each of the first to fourth inductors L11, L21, L31, and L41 is ¾ or more. In the present embodiment, each of the first and second inductors L11 and L21 is wound 11/4 times around an axis extending in a direction orthogonal to the stacking direction T. Each of the third and fourth inductors L31 and L41 is wound ⅞ times around an axis extending in a direction orthogonal to the stacking direction T.

In FIG. 8, a straight line with a reference sign A1 shows the axis around which the first inductor L11 is wound, a straight line with a reference sign A2 shows the axis around which the second inductor L21 is wound, a straight line with a reference sign A3 shows the axis around which the third inductor L31 is wound, and a straight line with a reference sign A4 shows the axis around which the fourth inductor L41 is wound. Each of the axes A1 to A4 may be an axis extending in a direction parallel to the Y direction. Alternatively, at least one of the axes A1 to A4 may be an axis extending in a direction inclined with respect to a direction parallel to the Y direction. The axes A1 to A4 may extend in directions different from each other.

The first inductor L11 has an opening surrounded by a plurality of conductors (plurality of conductor layers and plurality of through holes) composing the first inductor L11. The second inductor L21 has an opening surrounded by a plurality of conductors composing the second inductor L21.

The third inductor L31 has an opening surrounded by a plurality of conductors composing the third inductor L31. The fourth inductor L41 has an opening surrounded by a plurality of conductors composing the fourth inductor L41.

As shown in FIG. 7 and FIG. 8, the first to fourth inductors L11, L21, L31, and L41 are arranged to satisfy first to third requirements below. The first requirement is that the opening of the first inductor L11 and the opening of the third inductor L31 face each other. The second requirement is that the opening of the second inductor L21 and the opening of the fourth inductor L41 face each other. The third requirement is that a pair of the second inductor L21 and the fourth inductor L41 is arranged to be adjacent to a pair of the first inductor L11 and the third inductor L31.

In the present embodiment, the first inductor L11 and the third inductor L31 are arranged in a direction parallel to the Y direction so that the opening of the first inductor L11 and the opening of the third inductor L31 face each other (first requirement). The second inductor L21 and the fourth inductor L41 are arranged in a direction parallel to the Y direction so that the opening of the second inductor L21 and the opening of the fourth inductor L41 face each other (second requirement). The pair of the first inductor L11 and the third inductor L31 and the pair of the second inductor L21 and the fourth inductor L41 are arranged in a direction parallel to the X direction (third requirement).

In particular, in the present embodiment, the first inductor L11 and the second inductor L21 are adjacent to each other, and the third inductor L31 and the fourth inductor L41 are adjacent to each other. The first to fourth inductors L11, L21, L31, and L41 are arranged counterclockwise in the order of the first inductor L11, the second inductor L21, the fourth inductor L41, and then the third inductor L31 when seen from the stacking direction T.

The first inductor L11 is arranged near a corner located at a position where the side surface 50C and the side surface 50E intersect. The second inductor L21 is arranged near a corner located at a position where the side surface 50D and the side surface 50E intersect. The third inductor L31 is arranged near a corner located at a position where the side surface 50C and the side surface 50F intersect. The fourth inductor L41 is arranged near a corner located at a position where the side surface 50D and the side surface 50F intersect.

No conductor (conductor layer or through hole) for composing any component of the first to fourth filters 10, 20, 30, and 40 excluding the first inductor L11 and the second inductor L21 is arranged between the first inductor L11 and the second inductor L21. Note that a conductor for composing a component of the electronic component 1 other than the first to fourth filters 10, 20, 30, and 40 may be arranged between the first inductor L11 and the second inductor L21.

No conductor (conductor layer or through hole) for composing any component of the first to fourth filters 10, 20, 30, and 40 excluding the third inductor L31 and the fourth inductor L41 is arranged between the third inductor L31 and the fourth inductor L41. Note that a conductor for composing a component of the electronic component 1 other than the first to fourth filters 10, 20, 30, and 40 may be arranged between the third inductor L31 and the fourth inductor L41.

As employed herein, a structure formed by connecting two or more through holes in series will be referred to as a through hole line. The first inductor L11 includes a through hole line T1$a$, a through hole line T1$b$, and four through hole lines T1$c$. The through hole line T1$a$ is formed by the through holes 52T1$a$, 53T1$a$, 54T1$a$, 55T1$a$, 56T1$a$, and 57T1$a$. The through hole line T1$b$ is formed by the through holes 55T1$b$, 56T1$b$, and 57T1$b$. The four through hole lines T1$c$ are formed by the through holes 56T1$c$ and 57T1$c$.

The second inductor L21 includes a through hole line T2$a$, a through hole line T2$b$, and four through hole lines T2$c$. The through hole line T2$a$ is formed by the through holes 52T2$a$, 53T2$a$, 54T2$a$, 55T2$a$, 56T2$a$, and 57T2$a$. The through hole line T2$b$ is formed by the through holes 55T2$b$, 56T2$b$, and 57T2$b$. The four through hole lines T2$c$ are formed by the through holes 56T2$c$ and 57T2$c$.

The third inductor L31 includes a through hole line T3$a$, a through hole line T3$b$, and two through hole lines T3$c$. The through hole line T3$a$ is formed by the through holes 52T3$a$, 53T3$a$, 54T3$a$, 55T3$a$, 56T3$a$, and 57T3$a$. The through hole line T3$b$ is formed by the through holes 53T3$b$, 54T3$b$, 55T3$b$, 56T3$b$, and 57T3$b$. The two through hole lines T3$c$ are formed by the through holes 56T3$c$ and 57T3$c$.

The fourth inductor L41 includes a through hole line T4$a$, a through hole line T4$b$, and two through hole lines T4$c$. The through hole line T4$a$ is formed by the through holes 52T4$a$, 53T4$a$, 54T4$a$, 55T4$a$, 56T4$a$, and 57T4$a$. The through hole line T4$b$ is formed by the through holes 53T4$b$, 54T4$b$, 55T4$b$, 56T4$b$, and 57T4$b$. The two through hole lines T4$c$ are formed by the through holes 56T4$c$ and 57T4$c$.

Each of the first to fourth inductors L11, L21, L31, and L41 includes a plurality of winding parts each having the number of windings of $3/4$ or more and one or less. In the following, a configuration of the plurality of winding parts of each of the first to fourth inductors L11, L21, L31, and L41 will be described. In particular, in the present embodiment, the first inductor L11 includes three winding parts L11A, L11B, and L11C. The number of windings of each of the winding parts L11A and L11B is one. The number of windings of the winding part L11C is $3/4$. The winding parts L11A, L11B, and L11C are arranged in a direction parallel to the Y direction. The winding part L11C is arranged between the winding part L11A and the winding part L11B in both a structure and a circuit configuration and is electrically connected to the winding part L11A and the winding part L11B.

The winding part L11A is composed of the conductor layers 561A, 611A, and 621A, the through hole line T1$a$, one through hole line T1$c$ connecting the conductor layer 611A and the conductor layer 561A among the four through hole lines T1$c$, and two through holes connecting the conductor layer 611A and the conductor layer 621A. The conductor layers 611A and 621A are arranged between the through hole line T1$a$ and the one through hole line T1$c$ and the second surface 50B. Each of the conductor layers 611A and 621A is electrically connected to one end of each of the through hole line T1$a$ and the one through hole line T1$c$.

The winding part L11B is composed of the conductor layers 561B, 611B, and 621B, the through hole line T1$b$, one through hole line T1$c$ connecting the conductor layer 611B and the conductor layer 561B among the four through hole lines T1$c$, and two through holes connecting the conductor layer 611B and the conductor layer 621B. The conductor layers 611B and 621B are arranged between the through hole line T1$b$ and the one through hole line T1$c$ and the second surface 50B. Each of the conductor layers 611B and 621B is electrically connected to one end of each of the through hole line T1$b$ and the one through hole line T1$c$.

The winding part L11C is composed of the conductor layers 611C and 621C, two through hole lines T1$c$ connected to the conductor layer 611C among the four through hole lines T1$c$, and two through holes connecting the conductor layer 611C and the conductor layer 621C. The conductor layers 611C and 621C are arranged between the two through hole lines T1c and the second surface 50B. Each of the conductor layers 611C and 621C is electrically connected to one end of each of the two through hole lines T1c.

The second inductor L21 includes three winding parts L21A, L21B, and L21C. The number of windings of each of the winding parts L21A and L21B is one. The number of windings of the winding part L21C is ¾. The winding parts L21A, L21B, and L21C are arranged in a direction parallel to the Y direction. The winding part L21C is arranged between the winding part L21A and the winding part L21B in both a structure and a circuit configuration and is electrically connected to the winding part L21A and the winding part L21B.

The winding part L21A is composed of the conductor layers 562A, 612A, and 622A, the through hole line T2a, one through hole line T2c connecting the conductor layer 612A and the conductor layer 562A among the four through hole lines T2c, and two through holes connecting the conductor layer 612A and the conductor layer 622A. The conductor layers 612A and 622A are arranged between the through hole line T2a and the one through hole line T2c and the second surface 50B. Each of the conductor layers 612A and 622A is electrically connected to one end of each of the through hole line T2a and the one through hole line T2c.

The winding part L21B is composed of the conductor layers 562B, 612B, and 622B, the through hole line T2b, one through hole line T2c connecting the conductor layer 612B and the conductor layer 562B among the four through hole lines T2c, and two through holes connecting the conductor layer 612B and the conductor layer 622B. The conductor layers 612B and 622B are arranged between the through hole line T2b and the one through hole line T2c and the second surface 50B. Each of the conductor layers 612B and 622B is electrically connected to one end of each of the through hole line T2b and the one through hole line T2c.

The winding part L21C is composed of the conductor layers 612C and 622C, two through hole lines T2c connected to the conductor layer 612C among the four through hole lines T2c, and two through holes connecting the conductor layer 612C and the conductor layer 622C. The conductor layers 612C and 622C are arranged between the two through hole lines T2c and the second surface 50B. Each of the conductor layers 612C and 622C is electrically connected to one end of each of the two through hole lines T2c.

The third inductor L31 includes two winding parts L31A and L31B. The number of windings of the winding part L31A is one. The number of windings of the winding part L31B is ¾. The winding parts L31A and L31B are arranged in a direction parallel to the Y direction and also electrically connected to each other.

The winding part L31A is composed of the conductor layers 563, 613A, and 623A, the through hole line T3a, one through hole line T3c connecting the conductor layer 613A and the conductor layer 563 among the two through hole lines T3c, and two through holes connecting the conductor layer 613A and the conductor layer 623A. The conductor layers 613A and 623A are arranged between the through hole line T3a and the one through hole line T3c and the second surface 50B. Each of the conductor layers 613A and 623A is electrically connected to one end of each of the through hole line T3a and the one through hole line T3c.

The winding part L31B is composed of the conductor layers 613B and 623B, the through hole line T3b, one through hole line T3c connecting the conductor layer 613B and the conductor layer 563 among the two through hole lines T3c, and two through holes connecting the conductor layer 613B and the conductor layer 623B. The conductor layers 613B and 623B are arranged between the through hole line T3b and the one through hole line T3c and the second surface 50B. The conductor layer 613B is electrically connected to one end of each of the through hole line T3b and the one through hole line T3c.

The fourth inductor L41 includes two winding parts L41A and L41B. The number of windings of the winding part L41A is one. The number of windings of the winding part L41B is ¾. The winding parts L41A and L41B are arranged in a direction parallel to the Y direction and also electrically connected to each other.

The winding part L41A is composed of the conductor layers 564, 614A, and 624A, the through hole line T4a, one through hole line T4c connecting the conductor layer 614A and the conductor layer 564 among the two through hole lines T4c, and two through holes connecting the conductor layer 614A and the conductor layer 624A. The conductor layers 614A and 624A are arranged between the through hole line T4a and the one through hole line T4c and the second surface 50B. Each of the conductor layers 614A and 624A is electrically connected to one end of each of the through hole line T4a and the one through hole line T4c.

The winding part L41B is composed of the conductor layers 614B and 624B, the through hole line T4b, one through hole line T4c connecting the conductor layer 614B and the conductor layer 564 among the two through hole lines T4c, and two through holes connecting the conductor layer 614B and the conductor layer 624B. The conductor layers 614B and 624B are arranged between the through hole line T4b and the one through hole line T4c and the second surface 50B. Each of the conductor layers 614B and 624B is electrically connected to one end of each of the through hole line T4b and the one through hole line T4c.

Next, arrangement of the plurality of winding parts of each of the first to fourth inductors L11, L21, L31, and L41 will be described. The winding parts L21A, L21B, and L21C of the second inductor L21 are adjacent respectively to the winding parts L11A, L11B, and L11C of the first inductor L11. In the present embodiment, the distance between the winding part L11C and the winding part L21C is the same as the distance between the winding part L11A and the winding part L21A. The distance between the winding part L11C and the winding part L21C is the same as the distance between the winding part L11B and the winding part L21B.

The winding parts L41A and L41B of the fourth inductor L41 are adjacent respectively to the winding parts L31A and L31B of the third inductor L31. The distance between the winding part L31B and the winding part L41B may be the same as or may be different from the distance between the winding part L31A and the winding part L41A.

The conductor layers 611A, 611B, 611C, 612A, 612B, 612C, 613A, 613B, 614A, and 614B are arranged at the same position in the stacking direction T. The conductor layers 621A, 621B, 621C, 622A, 622B, 622C, 623A, 623B, 624A, and 624B are arranged at the same position in the stacking direction T.

Now, the operation and effects of the electronic component 1 according to the present embodiment will be described. In the present embodiment, the first inductor L11 of the first filter 10 and the second inductor L21 of the second filter 20 are not adjacent to each other in the circuit configuration. The first inductor L11 and the second inductor L21 are not electrically connected to each other. For this reason, it is difficult to adjust characteristics such as magnetic coupling between the first inductor L11 and the second inductor L21 in the circuit configuration.

In contrast to this, in the present embodiment, the first to fourth inductors L11, L21, L31, and L41 are arranged to satisfy the above-described first to third requirements. With this, according to the present embodiment, it is easy to adjust characteristics between the first inductor L11 and the second inductor L21 in the configuration. In other words, by arranging the first inductor L11 and the second inductor L21 to be adjacent to each other, the magnetic coupling between the first inductor L11 and the second inductor L21 can be made strong. Meanwhile, by arranging the first inductor L11 and the fourth inductor L41 to be adjacent to each other and arranging the first inductor L11 and the second inductor L21 not to be adjacent to each other, the magnetic coupling between the first inductor L11 and the second inductor L21 can be made weak.

According to the present embodiment, in particular, by the first and second requirements, it is possible to reduce a space for arranging the first to fourth inductors L11, L21, L31, and L41. With this, according to the present embodiment, the stack 50, in other words, the electronic component 1, can be miniaturized.

In the present embodiment, each of the first to fourth inductors L11, L21, L31, and L41 includes a plurality of winding parts. With this, according to the present embodiment, it is possible to reduce the openings of the first to fourth inductors L11, L21, L31, and L41 while maintaining the inductance of each of the first to fourth inductors L11, L21, L31, and L41. With this, according to the present embodiment, it is possible, for example, to reduce the stack 50 in size in the stacking direction T and consequently to miniaturize the stack 50.

In the present embodiment, the conductor layers 611A, 611B, 611C, 612A, 612B, 612C, 613A, 613B, 614A, and 614B composing the first to fourth inductors L11, L21, L31, and L41 are arranged at the same position in the stacking direction T. Similarly, the conductor layers 621A, 621B, 621C, 622A, 622B, 622C, 623A, 623B, 624A, and 624B composing the first to fourth inductors L11, L21, L31, and L41 are arranged at the same position in the stacking direction T. Moreover, these conductor layers are arranged at a position closer to the second surface 50B, which is the top surface of the stack 50, than the plurality of through hole lines composing the first to fourth inductors L11, L21, L31, and L41. According to the present embodiment, influence of other ground conductor layers and other shields arranged near the second surface 50B of the stack 50 can be made approximately uniform among the first to fourth inductors L11, L21, L31, and L41. Consequently, according to the present embodiment, adjustment of characteristics of the electronic component 1 assuming other ground conductor layers and other shields can be facilitated.

Figure 9:
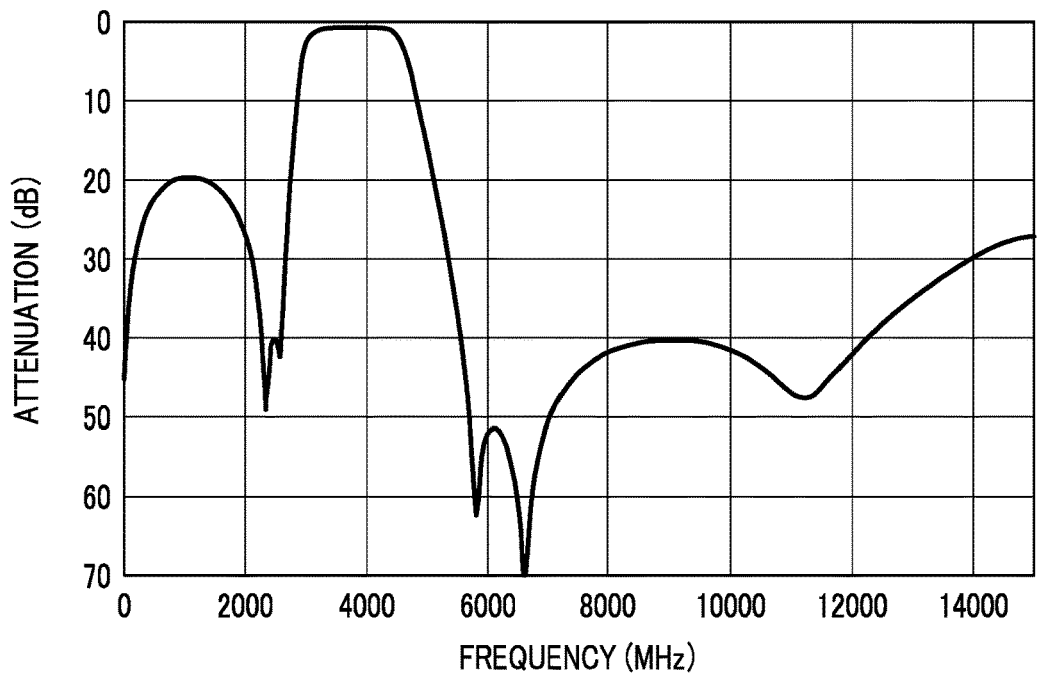
FIG. 9 is a characteristic chart showing an example of pass attenuation characteristics of the multilayer electronic component according to the first embodiment of the present invention.
Figure 10:
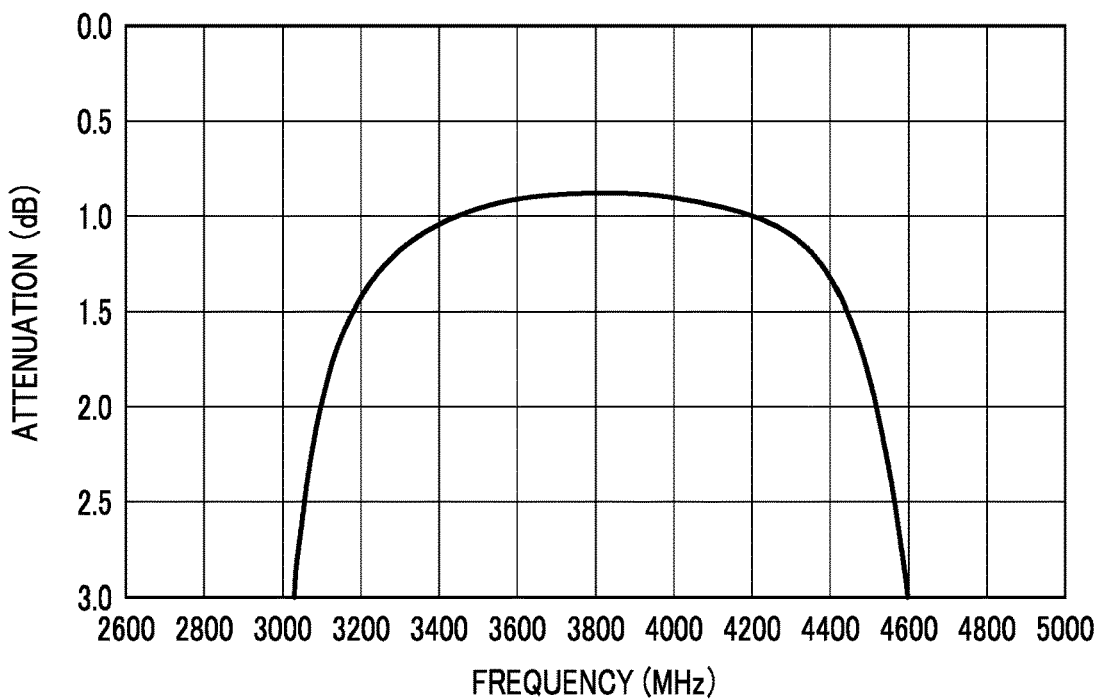
FIG. 10 is a characteristic chart showing part of the characteristics shown in FIG. 9 in an enlarged manner.
Figure 11:
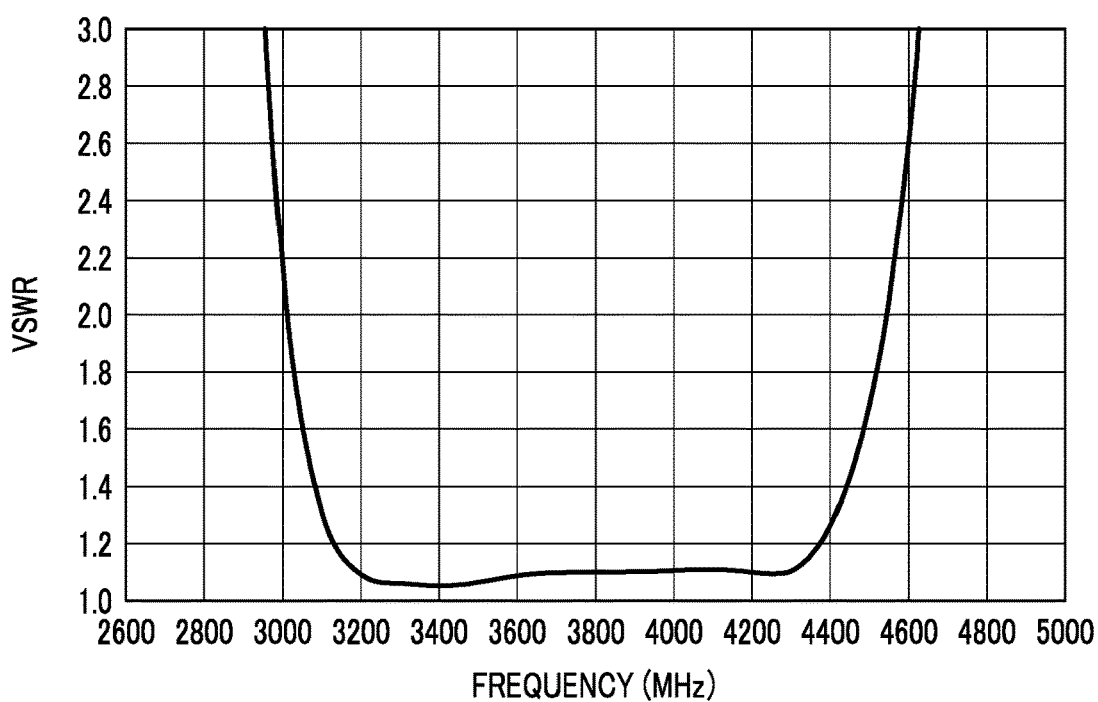
FIG. 11 is a characteristic chart showing an example of a voltage standing wave ratio of a first signal terminal of the multilayer electronic component according to the first embodiment of the present invention.
Figure 12:
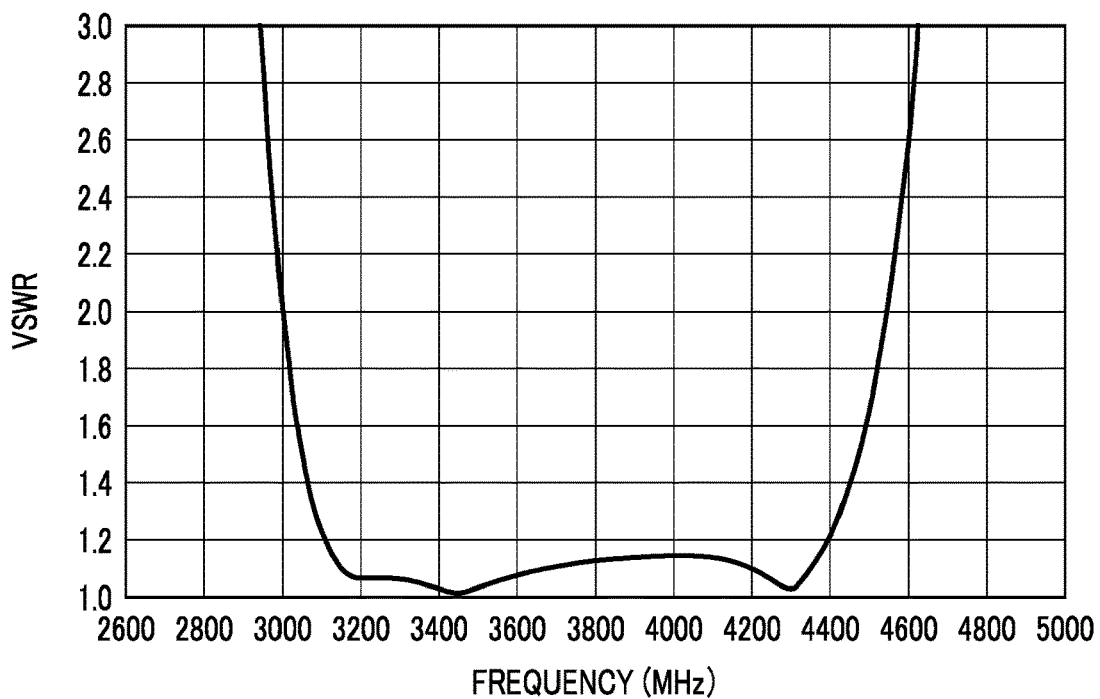
FIG. 12 is a characteristic chart showing an example of a voltage standing wave ratio of a second signal terminal of the multilayer electronic component according to the first embodiment of the present invention.

Now, an example of characteristics of the electronic component 1 according to the present embodiment will be described. FIG. 9 is a characteristic chart showing an example of pass attenuation characteristics of the electronic component 1. FIG. 10 is a characteristic chart showing part of FIG. 9 in an enlarged manner. In FIG. 9 and FIG. 10, the horizontal axis represents frequency, and the vertical axis represents attenuation. FIG. 11 is a characteristic chart showing frequency characteristics of a voltage standing wave ratio of the first signal terminal 2. FIG. 12 is a characteristic chart showing frequency characteristics of a voltage standing wave ratio of the second signal terminal 3. In FIG. 11 and FIG. 12, the horizontal axis represents frequency, and the vertical axis represents voltage standing wave ratio (VSWR). Note that FIG. 9 to FIG. 12 show characteristics in a case where another shield(s) is provided near the electronic component 1. As shown in FIG. 9 to FIG. 12, the electronic component 1 practically has sufficient characteristics as a band-pass filter.

Second Embodiment

Figure 13:
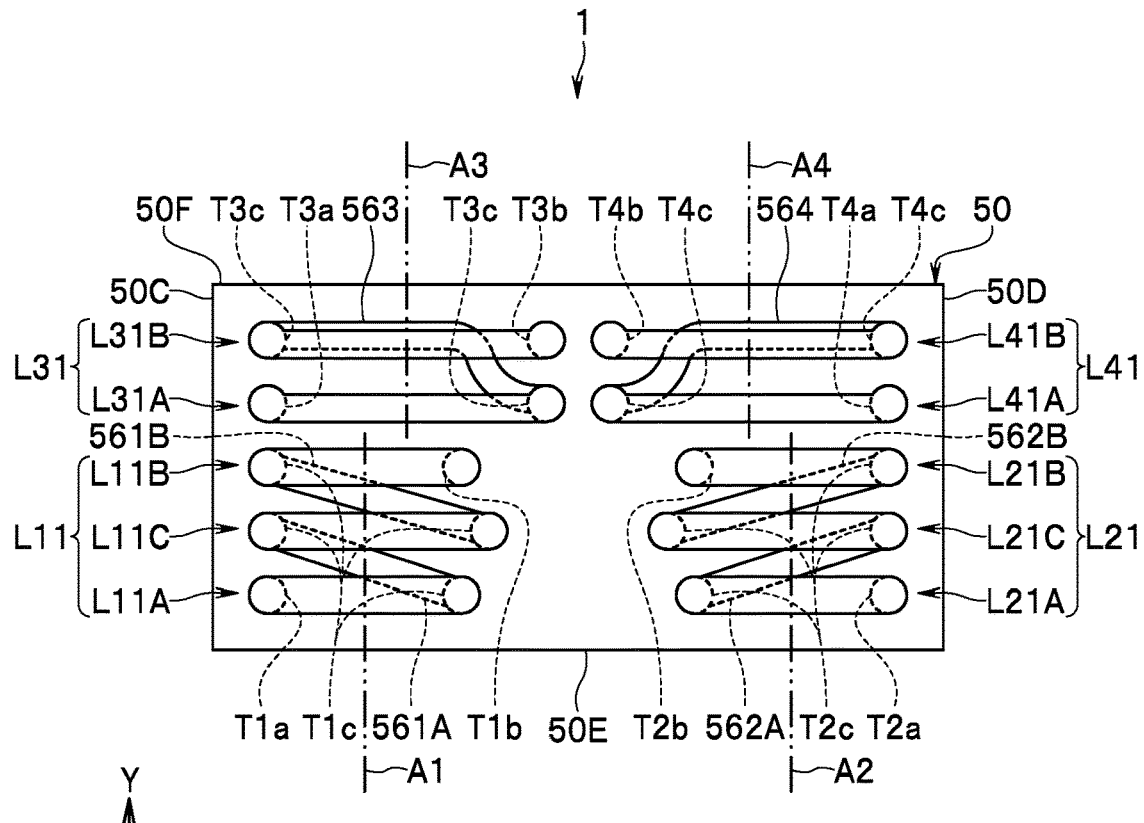
FIG. 13 is a plan view showing part of an internal structure of a stack of a multilayer electronic component according to a second embodiment of the present invention.

Next, a second embodiment of the present invention will be described with reference to FIG. 13. FIG. 13 is a plan view showing part of an internal structure of a stack 50 in the present embodiment, concretely, the first to fourth inductors L11, L21, L31, and L41.

In the present embodiment, the distance between the winding part L11C of the first inductor L11 and the winding part L21C of the second winding part L21 is smaller than the distance between the winding part L11A of the first inductor L11 and the winding part L21A of the second inductor L21. The distance between the winding part L11C of the first inductor L11 and the winding part L21C of the second inductor L21 is smaller than the distance between the winding part L11B of the first inductor L11 and the winding part L21B of the second inductor L21.

The winding part L11C is a winding part located, in the first inductor L11, at a position other than the both ends of the first inductor L11. Similarly, the winding part L21C is a winding part located, in the second inductor L21, at a position other than the both ends of the second inductor L21. According to the present embodiment, it is possible to increase the inductance of each of the first inductor L11 and the second inductor L21 while suppressing interaction between the first inductor L11 and the second inductor L21. In other words, according to the present embodiment, it is possible to increase the inductance of each of the first inductor L11 and the second inductor L21 while suppressing a decrease of the Q value of each of the first inductor L11 and the second inductor L21.

The configuration, operation, and effects of the present embodiment are otherwise the same as those of the first embodiment.

The present invention is not limited to the foregoing embodiments, and various modifications may be made thereto. For example, the configuration of each of the first to fourth filters 10, 20, 30, and 40 in the present invention can be any without being limited to the examples shown in each of the embodiments as long as satisfying the requirements of the claims.

The first to fourth filters 10, 20, 30, and 40 of the present invention may be part of a branching filter.

As described above, a multilayer electronic component of the present invention includes: a first filter which is a low-pass filter including a first inductor; a second filter which is a low-pass filter including a second inductor; a third filter which is a high-pass filter including a third inductor; a fourth filter which is a high-pass filter including a fourth inductor; and a stack for integrating the first filter, the second filter, the third filter, and the fourth filter, the stack including a plurality of dielectric layers stacked together. The first filter, the second filter, the third filter, and the fourth filter are provided in a manner that a first path from the first filter to the second filter includes a second path from the third filter to the fourth filter and is also longer than the second path in a circuit configuration. Each of the first inductor, the second inductor, the third inductor, and the fourth inductor is wound around an axis orthogonal to a stacking direction of the plurality of dielectric layers. The first inductor, the second inductor, the third inductor, and the fourth inductor are arranged in a manner that an opening of the first inductor and an opening of the third inductor face each other, an opening of the second inductor and an opening of the fourth inductor face each other, and a pair of the second inductor and the fourth inductor is adjacent to a pair of the first inductor and the third inductor.

In the multilayer electronic component of the present invention, the first inductor and the second inductor may be adjacent to each other. No conductor for composing any component of the first to fourth filters excluding the first inductor and the second inductor may be arranged between the first inductor and the second inductor.

In the multilayer electronic component of the present invention, each of the first inductor and the second inductor may include a plurality of winding parts each having the number of windings of ¾ or more and one or less. The plurality of winding parts may include a first winding part and a second winding part. The first winding part and the second winding part of the second inductor may be adjacent respectively to the first winding part and the second winding part of the first inductor. A distance between the second winding part of the first inductor and the second winding part of the second inductor may be smaller than a distance between the first winding part of the first inductor and the first winding part of the second inductor. The plurality of winding parts may further include a third winding part. The third winding part of the second inductor may be adjacent to the third winding part of the first inductor. In each of the first inductor and the second inductor, the third winding part may be provided between the first winding part and the second winding part in the circuit configuration. The distance between the second winding part of the first inductor and the second winding part of the second inductor may be smaller than a distance between the third winding part of the first inductor and the third winding part of the second inductor.

In the multilayer electronic component of the present invention, each of the third inductor and the fourth inductor may include a plurality of winding parts each having the number of windings of ¾ or more and one or less.

In the multilayer electronic component of the present invention, the stack may include a first surface and a second surface located at both respective ends in the stacking direction. Each of the first to fourth inductors may include a plurality of winding parts each having the number of windings of ¾ or more and one or less. Each of the plurality of winding parts may include a first through hole line and a second through hole line each constituted by a plurality of through holes being connected in series, and a conductor layer electrically connected to one end of the first through hole line and one end of the second through hole line. The conductor layer may be arranged between the first and second through hole lines and the second surface. The conductor layer of each of the plurality of winding parts of the first inductor, the conductor layer of each of the plurality of winding parts of the second inductor, the conductor layer of each of the plurality of winding parts of the third inductor, and the conductor layer of each of the plurality of winding parts of the fourth inductor may be arranged at a same position in the stacking direction.

In the multilayer electronic component of the present invention, the third filter may be provided between the first filter and the second filter in the circuit configuration. The fourth filter may be provided between the third filter and the second filter in the circuit configuration.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A multilayer electronic component comprising:
    a first filter which is a low-pass filter including a first inductor;
    a second filter which is a low-pass filter including a second inductor;
    a third filter which is a high-pass filter including a third inductor;
    a fourth filter which is a high-pass filter including a fourth inductor; and
    a stack for integrating the first filter, the second filter, the third filter, and the fourth filter, the stack including a plurality of dielectric layers stacked together, wherein
    the first filter, the second filter, the third filter, and the fourth filter are provided in a manner that a first path from the first filter to the second filter includes a second path from the third filter to the fourth filter and is also longer than the second path in a circuit configuration,
    each of the first inductor, the second inductor, the third inductor, and the fourth inductor is wound around an axis orthogonal to a stacking direction of the plurality of dielectric layers, and
    the first inductor, the second inductor, the third inductor, and the fourth inductor are arranged in a manner that an opening of the first inductor and an opening of the third inductor face each other, an opening of the second inductor and an opening of the fourth inductor face each other, and a pair of the second inductor and the fourth inductor is adjacent to a pair of the first inductor and the third inductor.

2. The multilayer electronic component according to claim 1, wherein the first inductor and the second inductor are adjacent to each other.

3. The multilayer electronic component according to claim 2, wherein no conductor for composing any component of the first to fourth filters excluding the first inductor and the second inductor is arranged between the first inductor and the second inductor.

4. The multilayer electronic component according to claim 1, wherein each of the first inductor and the second inductor includes a plurality of winding parts each having the number of windings of ¾ or more and one or less.

5. The multilayer electronic component according to claim 4, wherein
    the plurality of winding parts include a first winding part and a second winding part,
    the first winding part and the second winding part of the second inductor are adjacent respectively to the first winding part and the second winding part of the first inductor, and
    a distance between the second winding part of the first inductor and the second winding part of the second inductor is smaller than a distance between the first winding part of the first inductor and the first winding part of the second inductor.

6. The multilayer electronic component according to claim 5, wherein
    the plurality of winding parts further include a third winding part,
    the third winding part of the second inductor is adjacent to the third winding part of the first inductor,
    in each of the first inductor and the second inductor, the third winding part is provided between the first winding part and the second winding part in the circuit configuration, and the distance between the second winding part of the first inductor and the second winding part of the second inductor is smaller than a distance between the third winding part of the first inductor and the third winding part of the second inductor.

7. The multilayer electronic component according to claim 1, wherein each of the third inductor and the fourth inductor includes a plurality of winding parts each having the number of windings of ¾ or more and one or less.

8. The multilayer electronic component according to claim 1, wherein
the stack includes a first surface and a second surface located at both respective ends in the stacking direction,
each of the first to fourth inductors includes a plurality of winding parts each having the number of windings of ¾ or more and one or less,
each of the plurality of winding parts includes a first through hole line and a second through hole line each constituted by a plurality of through holes being connected in series and a conductor layer electrically connected to one end of the first through hole line and one end of the second through hole line,
the conductor layer is arranged between the first and second through hole lines and the second surface, and
the conductor layer of each of the plurality of winding parts of the first inductor, the conductor layer of each of the plurality of winding parts of the second inductor, the conductor layer of each of the plurality of winding parts of the third inductor, and the conductor layer of each of the plurality of winding parts of the fourth inductor are arranged at a same position in the stacking direction.

9. The multilayer electronic component according to claim 1, wherein
the third filter is provided between the first filter and the second filter in the circuit configuration, and
the fourth filter is provided between the third filter and the second filter in the circuit configuration.

* * * * *